US008760877B2

(12) United States Patent
Bhattacharya et al.

(10) Patent No.: US 8,760,877 B2
(45) Date of Patent: Jun. 24, 2014

(54) FLEXIBLE MODULAR ASSEMBLY

(75) Inventors: Rabin Bhattacharya, Silver Spring, MA (US); Martijn Krans, Den Bosch (NL); Liesbeth Van Pieterson, Heeze (NL); Thomas Schuler, Liege (BE); Guido Lamerichs, Hoeselt (BE); Erwin Altewischer, Eindhoven (NL)

(73) Assignee: Koninklijke Philips N.V., Eindhoven (NL)

( * ) Notice: Subject to any disclaimer, the term of this patent is extended or adjusted under 35 U.S.C. 154(b) by 101 days.

(21) Appl. No.: 13/133,411

(22) PCT Filed: Dec. 3, 2009

(86) PCT No.: PCT/IB2009/055478
§ 371 (c)(1),
(2), (4) Date: Jun. 8, 2011

(87) PCT Pub. No.: WO2010/067273
PCT Pub. Date: Jun. 17, 2010

(65) Prior Publication Data
US 2011/0242771 A1    Oct. 6, 2011

(30) Foreign Application Priority Data

Dec. 9, 2008    (EP) .................................... 08171032

(51) Int. Cl.
*H05K 1/00*    (2006.01)

(52) U.S. Cl.
USPC ........... 361/749; 361/760; 361/782; 361/784; 174/254; 174/258; 174/262

(58) Field of Classification Search
USPC .................... 361/749; 174/254; 362/145–147
See application file for complete search history.

(56) References Cited

U.S. PATENT DOCUMENTS

| 5,982,284 | A  | * | 11/1999 | Baldwin et al. ............ 340/572.8 |
| 6,498,592 | B1 | * | 12/2002 | Matthies ......................... 345/1.1 |
| 7,559,902 | B2 | * | 7/2009  | Ting et al. ...................... 600/529 |
| 8,022,307 | B2 | * | 9/2011  | Chu et al. ....................... 174/254 |
| 2004/0224138 | A1 | * | 11/2004 | Farrell et al. .................. 428/209 |
| 2004/0246684 | A1 | * | 12/2004 | Karaki ............................ 361/749 |
| 2005/0248935 | A1 |   | 11/2005 | Strip et al. |
| 2006/0254369 | A1 | * | 11/2006 | Yoon et al. ............... 73/862.041 |
| 2008/0074049 | A1 | * | 3/2008  | Kitai et al. .................... 313/509 |
| 2010/0296257 | A1 | * | 11/2010 | Yang et al. .................... 361/749 |

FOREIGN PATENT DOCUMENTS

| DE | 102006033894 A1 | 6/2007 |
| DE | 102007023651 A1 | 11/2008 |
| GB | 2396252 A | 6/2004 |
| WO | 2006129232 A2 | 12/2006 |

(Continued)

OTHER PUBLICATIONS

Buechley et al., "Fabric PCBs, electronic sequins, and socket buttons: techniques for e-textile craft", 2006, pp. 1-18.

(Continued)

*Primary Examiner* — Tuan T Dinh

(57) ABSTRACT

The present invention relates to a flexible modular assembly (100) comprising at least two flexible electronic modules (110 and 111) supported by a textile support (130). The two flexible electronic modules and the textile support each comprise a set of electrical conductors. The flexible modular assembly further comprises flexible connectors (140) for interconnecting two sets of electrical conductors. The flexible modular assembly of the invention is a modular textile assembly for use in large-area applications of electronic textiles.

14 Claims, 6 Drawing Sheets

(56) References Cited

FOREIGN PATENT DOCUMENTS

| WO | 2006129272 | A2 | 12/2006 |
| WO | 2008129118 | A1 | 10/2008 |
| WO | 2008152575 | A1 | 12/2008 |

OTHER PUBLICATIONS

Troster et al., "Wearable computing: packaging in textiles and clothes", 2003, pp. 1-6, Germany.

* cited by examiner

FLEXIBLE MODULAR ASSEMBLY

FIELD OF THE INVENTION

The present invention relates to a flexible modular assembly, in particular to a flexible modular assembly comprising electronic textiles, and to a method of manufacturing the flexible modular assembly.

BACKGROUND OF THE INVENTION

A textile is a material comprised of a network of fibres, that can for instance be manufactured by weaving, knitting, crocheting, knotting, or pressing fibres together. For this purpose, interlocked fibres known as yarns or threads may be used.

Many types of textiles are used in our every day life. When electronic components (i.e. devices that work by controlling the flow of electrons) are integrated into a textile new application fields emerge. When the textile is an integral part of the electrical circuit comprising the electronic components, an electronic textile is obtained.

An example of an electronic component is a LED package in the form of a surface mounted device (SMD-LED), which can be attached to a textile substrate by gluing, soldering, snap button connection or stitching. The resulting light-emitting textile could open up a wide range of new interior and apparel applications, ranging from illumination to atmosphere creation to messaging.

An electronic textile is known from UK patent application GB2396252A. The known electronic textile comprises SMD-LED's which are mounted at designated positions on a textile either by hand or by using conventional equipment known from the electronics assembly industry, such as a pick-and-place apparatus. The SMD-LED's are electrically addressable via conductive tracks, which are either formed from yarns woven into the textile, or from tracks printed onto the textile.

A drawback of the known electronic textile is that once it has been made, its size is fixed. For example, an electronic textile comprising a 7×7 matrix of SMD-LED's, once made, can only make a 7×7 display system.

For applications of electronic textiles that require coverage of large areas, there is a need for larger-sized systems.

SUMMARY OF THE INVENTION

In order to accommodate larger size applications, a skilled person would simply upscale the dimensions of the known textile. Such an approach, however, has the disadvantage of becoming quickly costly and difficult to pick and place components on. Since a textile is not a flat and rigid body, it is difficult to mount electronic components onto the textile in a sufficiently accurate way with a pick and place apparatus, especially for textiles with relatively large dimensions, such as, for instance, a textile with dimensions that exceed 0.5×0.5 square meter.

Furthermore, a problem found specifically with woven electronic textiles is that only certain types of electrically conductive yarns can be woven into the electronic textile. These yarns usually have a low conductance, limiting the amount of current that can flow through them. For larger woven systems, this will limit the number of electronic components that can be placed on the textile.

An assembly of interconnected PCBs can be made using a bus system. However such an assembly is bulky, inflexible, and requires a rack for the PCBs and the bus system to be housed and interconnected in a stable way. Furthermore, such an assembly is bound to a certain fixed geometry and is either not bendable and is only limited to that a certain number of PCBs can be interconnected. Additionally, ordinary PCBs are not drapeable.

It is therefore an object of the invention to provide a system for use in an electronic textile application that requires the coverage of a large area, and that does not have the above-mentioned drawbacks.

According to a first aspect of the invention, the object is realised by a flexible modular assembly, comprising a first flexible electronic module having a first set of electrical conductors, a second flexible electronic module having a second set of electrical conductors, a textile support for supporting the first flexible electronic module and the second flexible electronic module, the textile support having a third set of electrical conductors, and flexible connectors for connecting the first set of electrical conductors to the third set of electrical conductors and/or to the second set of electrical conductors.

The flexible modular assembly according to the invention is a modular textile assembly comprising flexible electronic modules that are interconnected by adhering them to a larger textile support. The flexible electronic modules can be adhered to the textile support by a number of methods including, but not limited to, lamination, stitching, embroidering, soldering, etc. Connection between these flexible electronic modules can be made either through connections at the edges of the modules, through connections made between the modules and the textile support, or through a combination of such connections.

The textile support can have electrically conductive yarns embroidered, stitched or woven into it with some pattern that allows for the supply of information (data) and/or power to contact points comprised on the individually adhered flexible electronic modules. Since the yarns do not necessarily need to be woven, high conductivity yarns can be used on the textile support, allowing for large electrical currents to be transmitted.

The connections can be made through a number of techniques such as soldering, clamping, gluing, stitching, etc. Communications between each of the individual flexible electronic modules can occur through the use of intelligent driver systems located in each flexible electronic module.

The flexible connectors for connecting the first set of electrical conductors to the third set of electrical conductors and/or to the second set of electrical conductors can be double-sided metal contacts, glue, stitching means, embroidering means or clamping means or any combination thereof. Examples of suitable stitching means and embroidering means are electrically conductive, with or without an insulative outer layer.

In a first embodiment of the flexible modular assembly according to the invention, the flexible connectors include a strain relief structure placed at a connection point. The flexible connectors may also include an electrically conductive flexible mechanical clamp.

In a second embodiment of the flexible modular assembly according to the invention, the first flexible electronic module and/or the second flexible electronic module is an electronic textiles.

In a third embodiment of the flexible modular assembly according to the invention, the first flexible electronic module and/or the second flexible electronic module is a flex foil.

The textile support may accommodate a driver PCB on one of its sides. The driver PCB may be located on a side of the textile support facing the first flexible electronic module. The driver PCB may alternatively be located on a side of the textile support opposite the side facing the first flexible electronic module.

In a fourth embodiment of the flexible modular assembly according to the invention, the third set of electrical conductors forms a network for supplying power and data signals to the first flexible electronic module and to the second flexible electronic module.

The first flexible electronic module and the second flexible electronic module may be of a different shape or a like shape, such as a rectangular, a square, or a triangle. The first flexible electronic module and the second flexible electronic module may have a similar component arrangement attached thereto. The component arrangement may comprise electronic components such as light emitting diodes.

According to a second aspect of the present invention, the object is realised by a method for manufacturing a flexible modular assembly comprising the steps of providing a first flexible electronic modules and a second flexible electronic module, arranging the first flexible electronic modules and the second flexible electronic module onto a textile support comprising a set of electrical conductors, and connecting the first flexible electronic module and the second flexible electronic module to the set of electrical conductors on the textile support through flexible connectors to interconnect the first flexible electronic module and the second flexible electronic module.

These and other aspect of the invention will be apparent from and elucidated with reference to the embodiments described hereinafter.

Generally, all terms used in the claims are to be interpreted according to their ordinary meaning in the technical field, unless explicitly defined otherwise herein. All references to "a/an/the/said [element, device, component, means, step, etc]" are to be interpreted openly as referring to at least one instance of said element, device, component, means, step, etc., unless explicitly stated otherwise. The steps of any method disclosed herein do not have to be performed in the exact order disclosed, unless explicitly stated.

By the term "strain relief structure" is understood rubber or plastic moulding over a connection point such as it is common with standard electronic cable connectors.

By the term "flexible mechanical clamp" is to be understood a mechanical connection that can bend back and forth without breaking such as a clamp that has hinges at its connection point so that it can move back and forth, or is encapsulated in a flexible material so that can move freely.

BRIEF DESCRIPTION OF THE DRAWINGS

Other features and advantages of the present invention will become apparent from the following detailed description of a presently preferred embodiment, with reference to the accompanying drawings, in which.

DETAILED DESCRIPTION OF THE INVENTION

Figure 1:
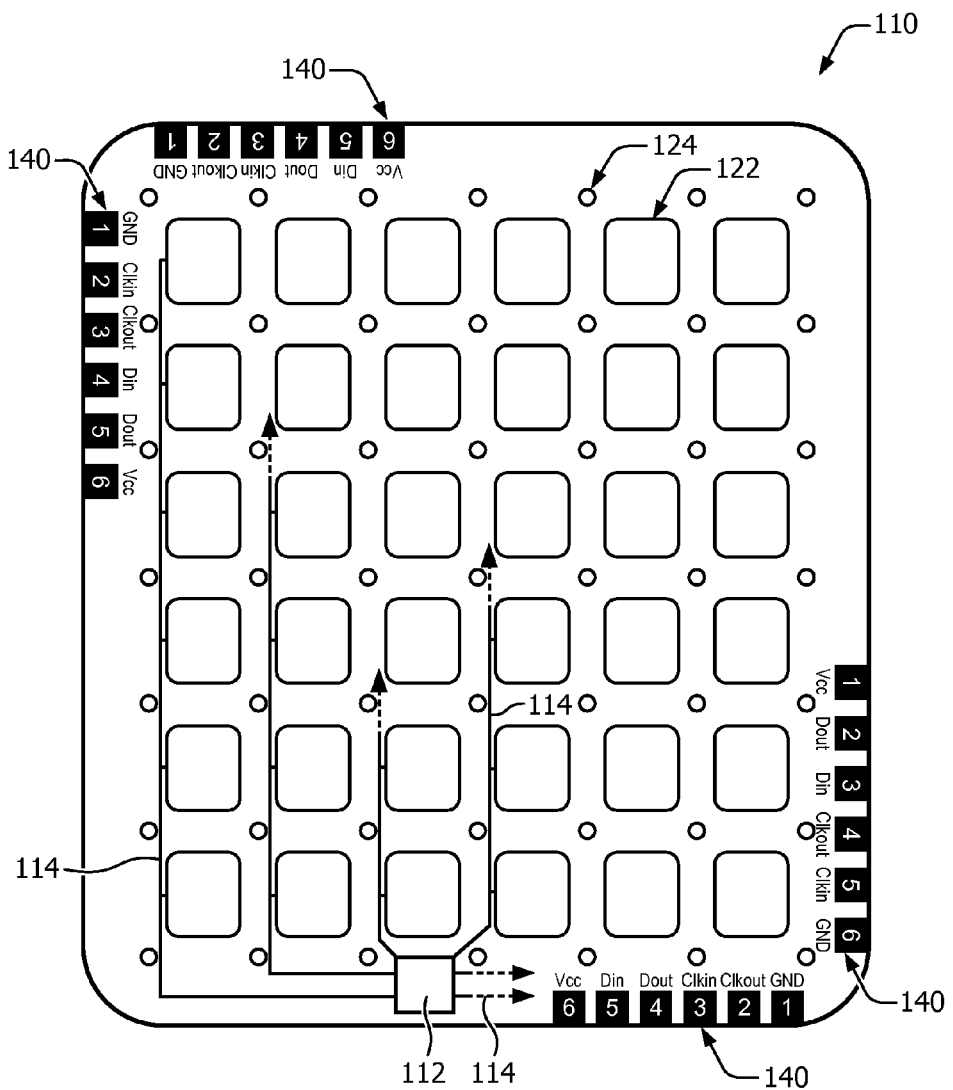
FIG. 1 shows an embodiment of a flexible electronic module.

The present invention will now be described more fully hereinafter with reference to the accompanying drawings, in which certain embodiments of the invention are shown. This invention may, however, be embodied in many different forms and should not be construed as limited to the embodiments set forth herein; rather, these embodiments are provided by way of example so that this disclosure will be thorough and complete, and will fully convey the scope of the invention to those skilled in the art. Like numbers refer to like elements throughout.

In general for FIGS. 1, 2, 3, 5 and 6 the reference numeral 140, though here shown referring to the contact pad, is intended to mean that the flexible electronic modules 110, 111, 120 and 121 can be adhered to the textile support 130 by a number of flexible connectors made by, for example, lamination, stitching, embroidering, soldering, gluing, clamping, double sided metal contacts, or any combination thereof. Stitching means and embroidering means may each be a flexible conductor such as an electrically conductive yarn, with or without an electrically insulative outer layer. The flexible connectors 140 may further include a strain relief structure placed at a connection point making the connection stronger to prevent that two electronic modules are pulled away from one another. In order to further strengthen the connection between modules 110, 111, 120 and 121 and the connection to the textile support 130 the flexible connectors 140 may additionally include a flexible mechanical clamp that is either conductive or non-conductive.

A schematic drawing in one embodiment of the invention is shown in FIG. 1, showing a flexible electronic module. FIG. 1 shows the outline of a flexible electronic module implemented as a flex foil tile 110 that consists of a 7×7 LED matrix with interconnection points on all 4 sides. The drawing also shows the locations of the LEDs 122 and the openings 124 in the flex-foil tile 110 which are needed to improve the foil's 110 flexibility and bendability.

Figure 2:
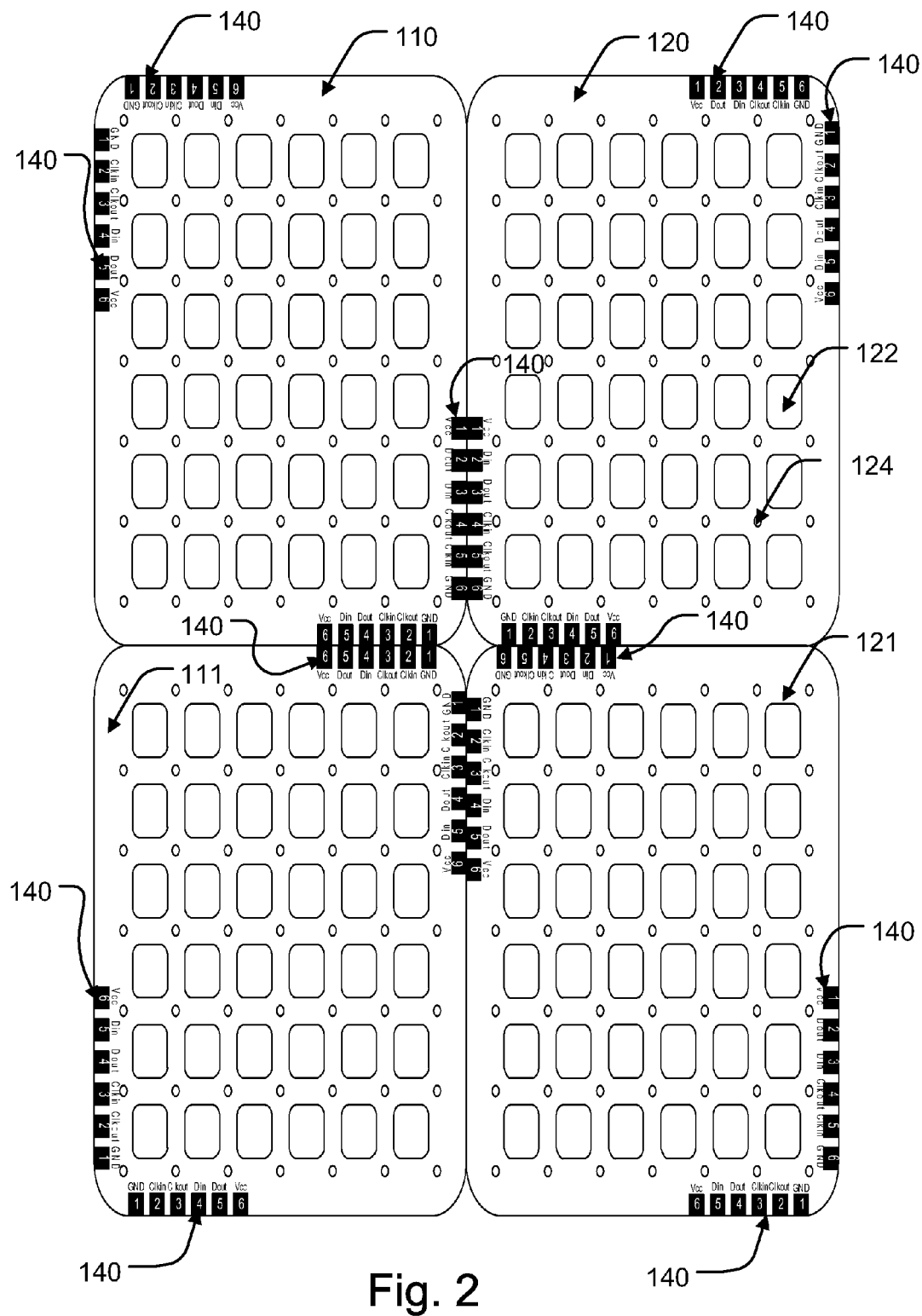
FIG. 2 shows an embodiment of four interconnected flexible electronic modules.

The flex foil 110 in FIG. 1 may be applied as a basic building block, e.g. to build a matrix, which matrix is larger than the 7×7 LED matrix. The flex foil can for example be a sheet of thin material that can be flexed multiple times without plastically deforming FIG. 2 shows an embodiment of a flexible modular assembly comprising four flexible electronic modules in the form of flex foil tiles. Clearly this set-up could be further extended in all directions using any suitable interconnection method. As an example interconnection between the flexible electronic modules (tiles) 110, 120, 111 and 121 in FIG. 2 must be made such that the connection is extremely robust. In order to achieve this, a number of solutions used in flex foil technologies can be used such as epoxy, mechanical snapping (i.e. crimp flex), or some combination thereof. Since the flexible electronic module 110, e.g. as a foil, is being used in an electronic textile application, this further increases the connection robustness through lamination of the foils 110, 120, 111 and 121 backside to a larger textile support 130, e.g. as a supporting conductive textile. Thus the supporting conductive textile has an area, which is greater than each of the respective areas of the electronic tiles 110, 120, 111 and 121 and has also an area which is greater than the sums of the areas for the four electronic tiles 110, 120, 111 and 121.

In order to improve the connectivity of the interconnection points further, the points may need to be connected by double sided metal contacts with holes in order to facilitate flow of epoxy between foils 110, 120, 111 and 121 and also in order to increase the electrical contact area, whereby the possible current density increases. The latter is of particular importance for the building of large systems.

Figure 3:
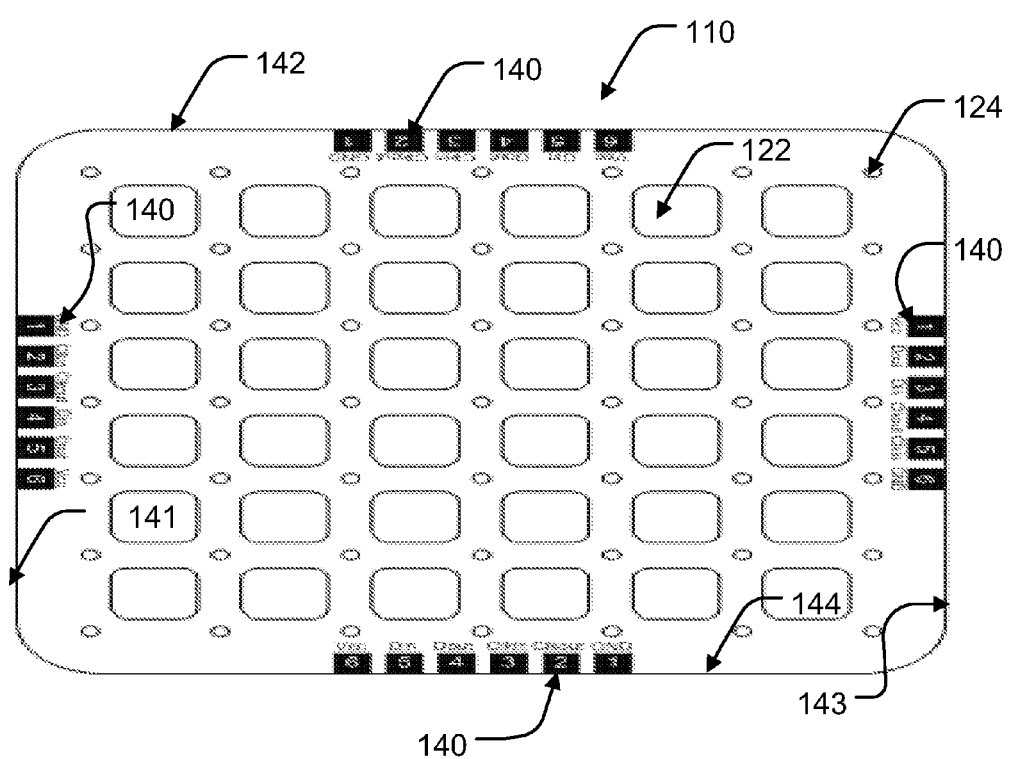
FIG. 3 shows an embodiment of a flexible electronic module.

FIG. 3 shows a further embodiment of a flexible electronic module. The interconnection points may be placed at the mid-points of the edges 141, 142, 143 and 144 of the flexible electronic module 110 in order to make them more uniform in appearance and possibly, making them even easier to assemble in the factory. Many of the interconnection points will have connections that run through the foil 110 at all locations. Thus, when such foils are tiled together, they form a continuous grid. Examples of such interconnection points are ground, power, clock, and global data. In order to increase throughput any interconnection point, such as the ground, the power, the clock or the global data may be implemented twice on the flexible electronic module 110.

However, some connectors or interconnection points may not be global, such as those pertaining to input and/or output data. Data sent through one of these connections must be processed by for example onboard electronics.

The onboard electronics 112 may make up an intelligent interconnection system 114 to the flexible electronic modules (110, 111, 120, 121) shown, e.g., in FIGS. 1-6. A purpose of such an intelligent interconnection system 114 may be to distribute image data throughout the flexible electronic modules 110, which may be implemented as display tiles. No new matter is added.

The interconnection system can be built in three ways: (1) preconfigured, (2) user configured, or (3) a mixed system.

With a preconfigured system, each flexible electronic module (tile) is given a serial address during manufacturing. An external image controller is also preconfigured to know how many flexible electronic modules (tiles) are in the system and what address corresponds to each flexible electronic module (tile).

With a user-configured system, each flexible electronic module has a dynamic serial address that configures itself when the system starts up. The flexible electronic modules (e.g. foils) communicate back to the controller to inform it how big the array is and what addresses correspond to each foil. Such a system, though more complex than the preconfigured system, is more generic, and allows for cheaper mass production (since the configuration step of each tile and controller is removed) and also allows for simple up scaling of existing systems.

With a mixed system, either the flexible electronic modules are pre-programmed with addresses, or controller boxes are configured to only handle systems that consist of certain sizes. Such an option may have cost and system stability advantages over the other two options.

Figure 4:
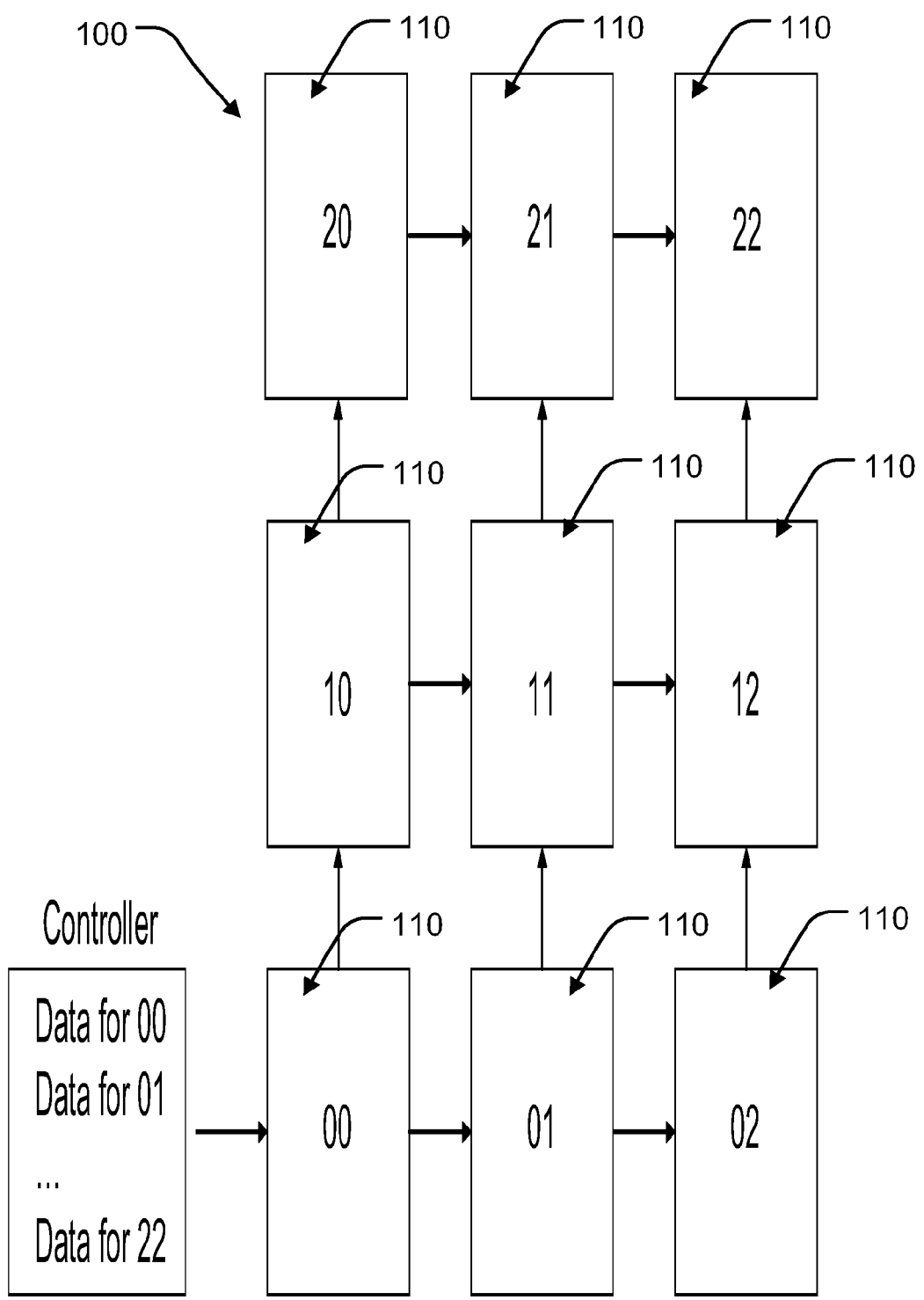
FIG. 4 shows an embodiment of data communication between nine flexible electronic modules.

All three systems described above use the same method for displaying data on the flexible electronic modules. Data is sent to a controller, which then outputs it to the flexible electronic modules, for example to flex foils. The controller's communication lines, along with the overall systems power lines which come from the controller, are then connected to one or more flexible electronic modules, e.g. to tiles in the matrix. When sending an image, the first thing that occurs is that the controller receives the image data. This can be done in many different ways (i.e. Bluetooth, SMS, USB, etc.). When an image is loaded to the controller, it is broken up into a number of 7×7 grids that correspond to the known size of the flex-foil array, i.e. how the flexible electronic modules are connected to define the array. These broken images are coded into a serial scheme and given an address that corresponds to the flexible electronic module in the system that must display the image. This coded image is then sent through the controller data line to the input flexible electronic module or flexible electronic modules, e.g. foil or foils, respectively which can then broadcast the coded image to the rest of the flexible electronic modules in the system. FIG. 4 shows schematically this process. Thus in the following an embodiment illustrates how the aforementioned flexible electronic modules communicate.

FIG. 4 shows an embodiment of data communication between nine flexible electronic modules. The figure shows schematically data communication between nine flexible electronic modules, for example 9 flex-foils, each referenced with 110. Each flex foil has a unique address. The controller takes the original image and breaks it, i.e. the controller deconstructs it into 9 quadrants with 7×7 pixels in each quadrant.

Deconstructed data is then encoded into data packets that have a unique address, which corresponds to the foil in the matrix that must display that encoded image. The controller then sends these data packets out for each of the addresses in the system. The foils receive their respective data packets and their drivers output the encoded data. The total constructed image from all of the foils will then form the original image that was loaded in the controller.

Using the data communication method described, it is possible to create structures of almost any size without the need of complex interconnects. Since there may be only one type of flexible electronic modules, for example a tile is used, this tile can be produced, reproduced and tested cheaply. The system can easily be modified to have tiles with any number of lighting elements, for example LEDs, as long as the tile is configured to be of a shape that connects to a similar-shaped tile, for example the tiles are each of a different shape or of a like shape such as rectangular shape, a square, or a triangle.

Further, the data communication method supports any number of interconnection points, as long as they fit on the tile. The data communication method also supports interconnection points that need a defined data direction (data-out->data-in), as well as global data flow, thus the method introduces inherent redundancy in bigger tiling systems as the signals can arrive through different tiles. It improves mechanical robustness as the system is built up of small, identical tiles that are interconnected by flexible interconnects.

The method decreases system cost as it is possible to adjust the size of the system tile to an optimal size. This system tile can than be produced in high quantities.

In the following two figures, the four flexible electronic modules are respectively denoted 110, 120, 111 and 121 and are connected to a larger textile support 130.

Figure 5:
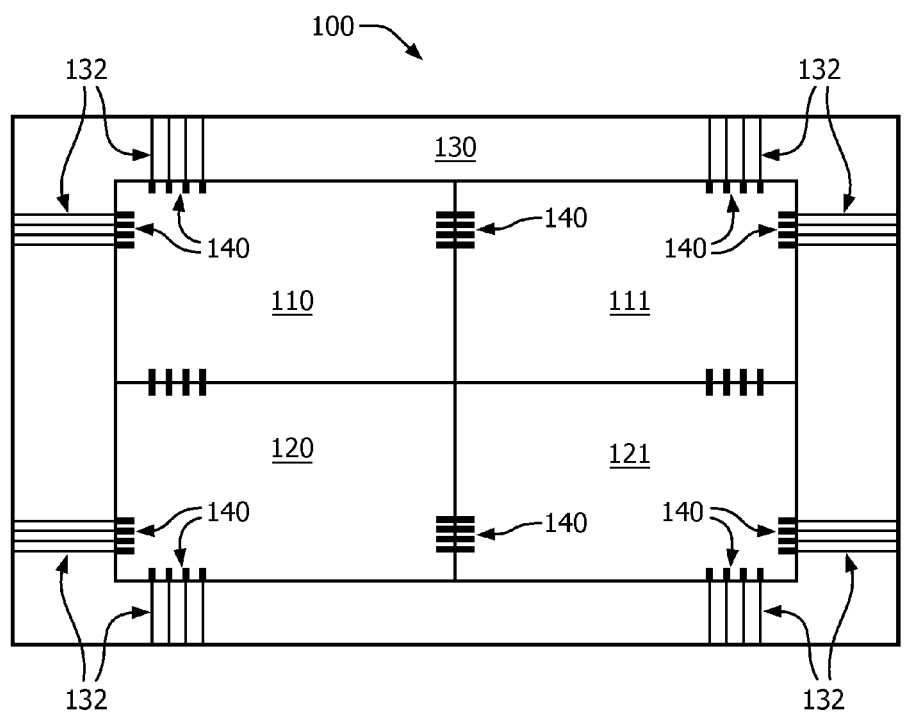
FIG. 5 shows an embodiment of four flexible electronic modules connected to a support.

FIG. 5 shows four flexible electronic modules connected to each other at their corners and mounted to the textile support 130. The textile support 130 has communication lines, which also connect to the modules in order to improve reliability.

It is possible to connect the smaller flexible electronic modules 110, 120, 111 and 121 together by adhering them to a larger textile support 130. The flexible electronic modules 110, 120, 111 and 121 can be adhered to the textile support 130 by a number of methods including, but not limited to, lamination, stitching, embroidering, and soldering. Connection between these four smaller flexible electronic modules 110, 120, 111 and 121 can also be made through flexible connectors 140 at the edges of the modules 110, 120, 111 and 121.

Figure 6:
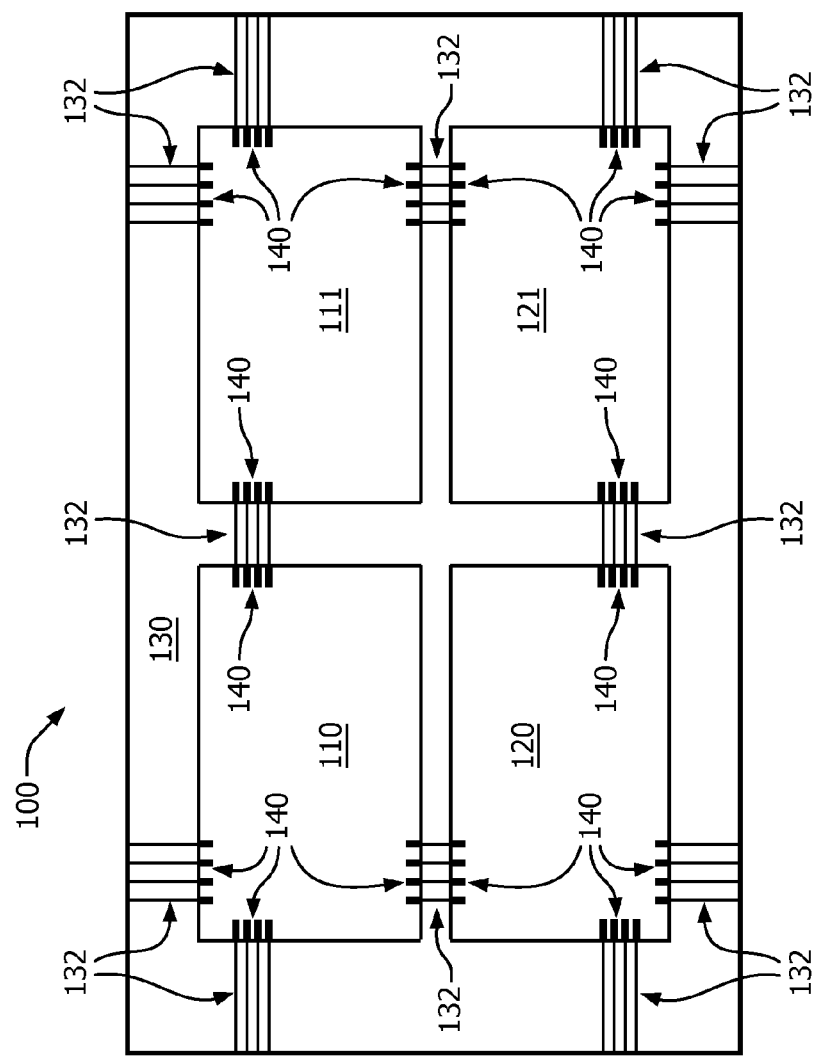
FIG. 6 shows an embodiment of four flexible electronic modules connected to one another and to a support.

FIG. 6 shows an embodiment of four flexible electronic modules connected to one another and to the textile support 130. Connection between the modules 110, 120, 111 and 121 can be made through connectors 140 made between the modules 110, 120, 111 and 121 and the textile support 130, for example between opposite facing sides and/or edges thereof. Further, or alternatively, connections between the modules 110, 120, 111 and 121 can be made through connections made between the modules 110, 120, 111 and 121 and the textile support 130 through a combination of connections 140 made at the edges or opposite sides of the flexible electronic modules 110, 120, 111 and 121, and through connections 140 to the textile support 130, e.g. via a driver PCB on the textile support 130 to one or more of the smaller modules 110, 120, 111 and 121.

In FIG. 6 the electronic modules 110, 120, 111 and 121 are foils that are electrically attached together and also to the textile substrate 130. The textile substrate 130 may consist of a plurality of communication lines. The foils 110, 120, 111 and 121 can be mounted to the textile support 130 such that the electrical connection points between foils 110, 120, 111 and 121 are also aligned and mounted to the communication lines of the textile support 130 in order to improve electrical contact stability of the assembly 100.

In another embodiment, a flex-foil system is designed in order to be able to interface directly with the textile support 130. In such an embodiment, the textile support 130 must contain a plurality of communication lines 132. The foils 110, 120, 111 and 121 are not connected directly to each other, but are instead only connected to the textile support 130. The foils 110, 120, 111 and 121 are aligned to connect to the communication lines 132, such that these lines form an electrical connection between the foils 110, 120, 111 and 121. No new matter is added.

In another embodiment, an electronic textile, with a driver PCB for driving a certain number of LEDs, is designed in order to be able to interface with other electronic textiles. The electronic textiles 110, 120, 111 and 121 can then be electrically attached together and also attached to the textile support 130. The textile support 130 may consist of a plurality of communication lines. The electronic textiles 110, 120, 111 and 121 can be mounted to the textile support 130 such that the electrical connection points between electronic textiles 110, 120, 111 and 121 are also aligned and mounted to the textile support 130 by means of communication lines in order to improve electrical contact stability of the system 100.

In another embodiment, an electronic textile, with a driver PCB for driving a certain number of LEDs, is designed in order to be able to interface directly with the textile support 130. In such an embodiment, the textile support 130 must contain a plurality of communication lines. The electronic textiles 110, 120, 111 and 121 are not connected directly to each other, but are instead only connected to the textile support 130. The electronic textiles 110, 120, 111 and 121 are aligned to connect to the communication lines. The communication lines may define a number of buses, such that these buses form an electrical connection between the foils 110, 120, 111 and 121.

In another embodiment, driver PCBs are attached to the textile support 130, which also includes communication lines. Electronic textile or foil substrates 110, 120, 111 and 121 are then attached to this textile support 130 accordingly. The driver PCBs can be placed on either the same side that the electronic textiles 110, 120, 111 and 121 are mounted to, or placed on the opposite side.

In any of the aforementioned embodiments, the flexible electronic modules may be made as electronic textile(s). An electronic textile is obtained when an electronic component (i.e. a device that works by controlling the flow of electrons) is integrated into a textile so that the textile is an integral part of the electrical circuit comprising the electronic component.

Although the present invention has been described in connection with particular embodiments thereof, it is to be understood that various modifications, alterations and adaptations may be made by those skilled in the art without departing from the claimed scope, for example following the spirit of the invention the two flexible electronic modules 110 and 120 may be extended to an unlimited number of flexible electronic modules or modular tiles resulting in flexible modular assemblies comprising a textile support that exceed 1×1, 2×2, etc square meters. Such modular textile assemblies provided with LEDs may be applied to illuminate relative large areas, e.g. in a sports arena or as backlit to a billboard.

The invention claimed is:

1. A flexible modular assembly comprising:
a first flexible electronic module including a first module substrate having a first array of substrate openings formed in the module substrate, the first array of substrate openings being configured to allow the first module substrate to flex or bend, the first module substrate further comprising a first array of electronic devices, the first array of electronic devices being coupled to a first set of flexible electrical connectors,
at least one second flexible electronic module including a second module substrate having a second array of substrate openings formed in the module substrate, the second array of substrate openings being configured to allow the at least one second module substrate to flex or bend, the second module substrate further comprising a second array of electronic devices, the second array of electronic devices being coupled to a second set of flexible electrical connectors,
a textile support for supporting the first flexible electronic module and the second flexible electronic module, the textile support having a third set of electrical conductors configured to interconnect the first set of flexible electrical connectors and the second set of flexible electrical connectors.

2. The flexible modular assembly according to claim 1, wherein the first module substrate and/or the second module substrate includes a flex foil.

3. The flexible modular assembly according to claim 1, wherein the third set of electrical conductors forms a network for supplying power and data signals to the first flexible electronic module and to the at least one second flexible electronic module.

4. A method for manufacturing a flexible modular assembly comprising the steps of:
providing a first flexible electronic module and at least one, second flexible electronic module, each module comprising a module substrate having an array of substrate openings formed in the module substrate, the array of substrate openings being configured to allow the module substrate to flex or bend without damaging the module substrate, the module substrate further comprising an array of electronic devices, the array of electronic devices being coupled to a first set of flexible electrical connectors on the first flexible electronic module and a second set of flexible electrical connectors on the at least one second flexible electronic module,
arranging the first flexible electronic module and the second flexible electronic module onto a textile support comprising a third set of electrical conductors, and
connecting the first flexible electronic module and the second flexible electronic module to the third set of electrical conductors on the textile support through the first and second sets of flexible electrical connectors to interconnect the first flexible electronic module and the at least one second flexible electronic module.

5. The flexible modular assembly according to claim 1, wherein the first array of electronic devices includes a first array of light emitting elements and the second array of electronic devices includes a second array of light emitting diode elements, the first array of light emitting elements and the second array of light emitting elements being configured to display an integrated image covering at least a portion of the first module substrate and at least a portion of the second module substrate.

6. The flexible modular assembly according to claim 1, wherein the first array of electronic devices is coupled to the first set of flexible electrical connectors by an. addressable interconnection system.

7. The flexible modular assembly according to claim 6, wherein the addressable interconnection system is provided with an address as part of a manufacturing process before the assembly enters a stream of commerce.

8. The flexible modular assembly according to claim 6, wherein the addressable interconnection system is provided with a dynamic address as part of an assembly initialization process.

9. The flexible modular assembly according to claim 1, wherein the second array of electronic devices is coupled to the second set of flexible electrical connectors by an addressable interconnection system.

10. The flexible modular assembly according to claim 9, wherein the addressable interconnection system is provided with an address as part of a manufacturing process before the assembly enters a stream of commerce.

11. The flexible modular assembly according to claim 9, wherein the addressable interconnection system is provided with a dynamic address as part of an assembly initialization process.

12. The flexible modular assembly according to claim 1, wherein the first flexible electronic module or the at least one second flexible electronic module includes onboard electronics configured to distribute image data to at least a portion of the first array of electronic devices and at least a portion of the second array of electronic devices.

13. The flexible modular assembly according to claim 12, wherein the image data is obtained from an external source via the first set of flexible electrical connectors or the second set of flexible electrical connectors.

14. The flexible modular assembly according to claim 12, wherein the first flexible electronic module is configured as a first display tile and the at least one second flexible electronic module is configured as at least one second display tile, the first display tile and the at least one second display tile comprising a flexible image display system.

* * * * *